(12) United States Patent
Gottwald

(10) Patent No.: US 10,804,319 B2
(45) Date of Patent: Oct. 13, 2020

(54) TOP PINNED MTJ STACK WITH SYNTHETIC ANTI-FERROMAGNETIC FREE LAYER AND AlN SEED LAYER

(71) Applicant: International Business Machines Corporation, Armonk, NY (US)

(72) Inventor: Matthias G. Gottwald, New Rochelle, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/277,412

(22) Filed: Feb. 15, 2019

(65) Prior Publication Data

US 2020/0266236 A1  Aug. 20, 2020

(51) Int. Cl.
| | |
|---|---|
| *H01L 27/22* | (2006.01) |
| *H01L 43/10* | (2006.01) |
| *G11C 11/16* | (2006.01) |
| *H01L 43/02* | (2006.01) |
| *H01L 43/08* | (2006.01) |

(52) U.S. Cl.
CPC .......... *H01L 27/224* (2013.01); *G11C 11/161* (2013.01); *H01L 43/02* (2013.01); *H01L 43/08* (2013.01); *H01L 43/10* (2013.01)

(58) Field of Classification Search
CPC ... H01L 27/22; H01L 27/222; H01L 27/2224; H01L 43/02; H01L 43/08; H01L 43/10

USPC .......................................................... 257/421
See application file for complete search history.

(56) References Cited

U.S. PATENT DOCUMENTS

| | | | |
|---|---|---|---|
| 9,614,147 B2* | 4/2017 | Park | H01L 43/10 |
| 2010/0096716 A1* | 4/2010 | Ranjan | B82Y 10/00 |
| | | | 257/421 |
| 2016/0171135 A1 | 6/2016 | Datta et al. | |
| 2016/0276581 A1 | 9/2016 | Park et al. | |
| 2017/0186942 A1 | 6/2017 | Lee et al. | |

* cited by examiner

*Primary Examiner* — Monica D Harrison

(74) *Attorney, Agent, or Firm* — Scully, Scott, Murphy & Presser, P.C.; Daniel P. Morris, Esq.

(57) ABSTRACT

A top pinned magnetic tunnel junction (MTJ) stack for use in spin-transfer torque magnetoresistive random access memory (STT MRAM) is provided. The top pinned MTJ stack contains a synthetic anti-ferromagnetic magnetic free layer stack that is formed on an insulating aluminum nitride (AlN) seed layer having hexagonal symmetry. For such a top pinned MTJ stack, the symmetry requirements for the tunnel barrier layer do not conflict anymore with the symmetry requirements for strong anti-ferromagnetic exchange. Further, and compared to using only a metallic seed, the insulating AlN seed layer limits spin pumping from the magnetic free layer into the metallic seed layer and therefore lowers the switching current, while only making a small contribution to the resistance of a STT MRAM.

20 Claims, 2 Drawing Sheets

TOP PINNED MTJ STACK WITH SYNTHETIC ANTI-FERROMAGNETIC FREE LAYER AND AlN SEED LAYER

BACKGROUND

The present application relates to magnetoresistive random access memory (MRAM). More particularly, the present application relates to a top pinned magnetic tunnel junction (MTJ) stack that improves the performance of spin-transfer torque (STT) MRAM.

Spin-transfer torque MRAM uses a 2-terminal device as is shown, for example, in FIG. 1A (bottom pinned MTJ stack) that includes a MTJ stack that contains a magnetic pinned (or reference) layer 10, a tunnel barrier layer 12, a magnetic free layer 14 and a capping layer 16. FIG. 1B shows an alternative MTJ stack (a top pinned MTJ stack) that can be used as a component of a STT MRAM. The MTJ stack of FIG. 1B includes a metallic seed layer 15, a magnetic free layer 14, a tunnel barrier layer 12, and a magnetic pinned layer 10. In the drawings, the arrow within the magnetic pinned layer shows a possible orientation of that layer and the double headed arrows in the magnetic free layer(s) illustrate that the orientation in those layers can be switched.

In the MTJ stacks shown in FIGS. 1A-1B, the magnetization of the magnetic pinned layer 10 is fixed in one direction (say pointing up) and a current passed down through the junction makes the magnetic free layer 14 parallel to the magnetic pinned layer 10, while a current passed up through the junction makes the magnetic free layer 14 anti-parallel to the magnetic pinned layer 10. A smaller current (of either polarity) is used to read the resistance of the device, which depends on the relative orientations of the magnetizations of the magnetic free layer 14 and the magnetic pinned layer 10. The resistance is typically higher when the magnetizations are anti-parallel, and lower when they are parallel (though this can be reversed, depending on the material).

In order make to the magnetic free layer of MTJ stacks less sensitive to external fields, magnetic free layer stacks, such as, shown in FIG. 2, that include two magnetic layers (20, 24) that are anti-ferromagnetically coupled using a coupling layer 22 of ruthenium (Ru), iridium (Ir) or rhodium (Rh) have been suggested. Such a stack may be referred to as a synthetic anti-ferromagentic magnetic free layer stack.

However, the design of high performance top pinned MTJ stacks with a synthetic anti-ferromagnetic magnetic free layer stack is challenging. This is because the combination of the need for hexagonal magnetic free layer symmetry for strong anti-ferromagnetic coupling conflicts with the need for cubic/amorphous symmetry for the magnetic free layer for high tunneling magneto-resistance (TMR). Furthermore, if a magnetic free layer is grown with strong texture on a metallic seed layer, spin pumping will increase the necessary switching currents lowering the spin-torque efficiency of the MTJ stack.

There is thus a need for providing a high performance top pinned MTJ stack with a synthetic anti-ferromagentic magnetic free layer stack which overcomes the aforementioned drawbacks.

SUMMARY

A top pinned magnetic tunnel junction (MTJ) stack for use in spin-transfer torque magnetoresistive random access memory (STT MRAM) is provided. The top pinned MTJ stack contains a synthetic anti-ferromagnetic magnetic free layer stack that is formed on an insulating aluminum nitride (AlN) seed layer having hexagonal symmetry. For such a top pinned MTJ stack, the symmetry requirements for the tunnel barrier layer do not conflict anymore with the symmetry requirements for strong anti-ferromagnetic exchange. Further, and compared to using only a metallic seed layer, the insulating AlN seed layer limits spin pumping from the magnetic free layer into the metallic seed layer and therefore lowers the switching current, while only making a small contribution to the resistance of a STT MRAM.

In one aspect of the present application, a top pinned MTJ stack is provided. In one embodiment, the top pinned MTJ stack includes a magnetic free layer stack located on an insulating aluminum nitride seed layer having hexagonal symmetry. The magnetic free layer stack includes a first magnetic layer, a synthetic anti-ferromagnetic coupling layer, and a second magnetic layer. A tunnel barrier layer having cubic symmetry is located on the second magnetic layer of the magnetic free layer stack, and a magnetic pinned layer is located on the tunnel barrier layer.

In another aspect of the present application, a spin-transfer torque magnetoresistive random access memory (STT MRAM) that has improved performance is provided. In one embodiment, the STT MRAM includes a top pinned MTJ stack located between a bottom electrode and a top electrode. The top pinned MTJ stack a magnetic free layer stack located on an insulating aluminum nitride seed layer having hexagonal symmetry. The magnetic free layer stack includes a first magnetic layer, a synthetic anti-ferromagnetic coupling layer, and a second magnetic layer. A tunnel barrier layer having cubic symmetry is located on the second magnetic layer of the magnetic free layer stack, and a magnetic pinned layer is located on the tunnel barrier layer.

DETAILED DESCRIPTION

Figure 1A:
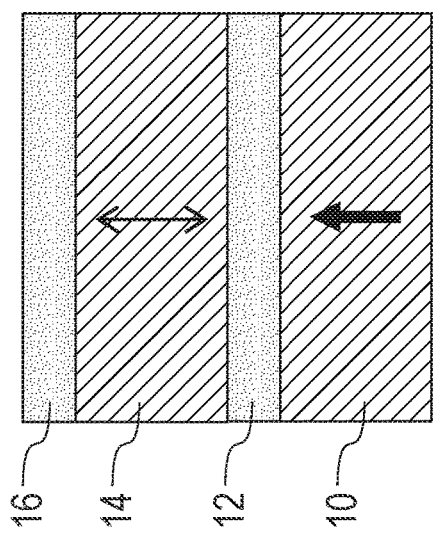
FIG. 1A is a cross sectional view of a prior art MTJ stack including, from bottom to top, a magnetic pinned (or reference) layer, a tunnel barrier layer, a magnetic free layer, and a capping layer.
Figure 1B:
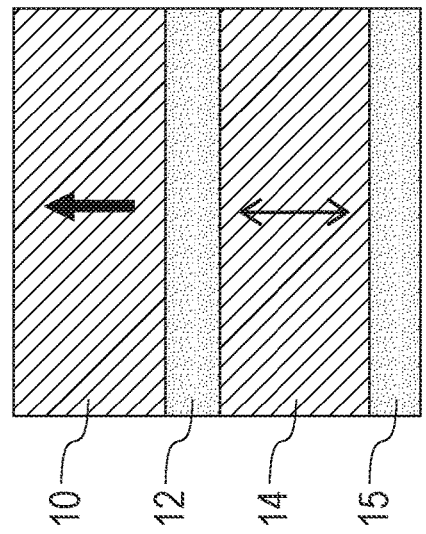
FIG. 1B is a cross sectional view of another prior MTJ stack including, from bottom to top, a metallic seed layer, a magnetic free layer, a tunnel barrier layer, and a magnetic pinned layer.
Figure 2:
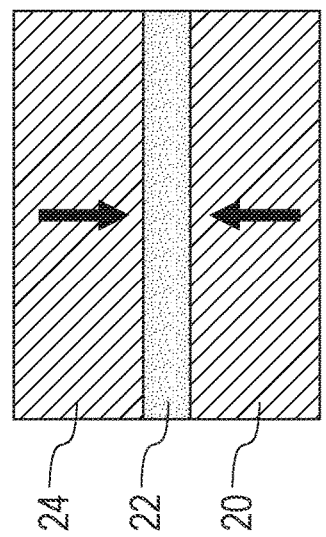
FIG. 2 is a cross sectional view showing a coupling layer located between two anti-ferromagnets.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 3:
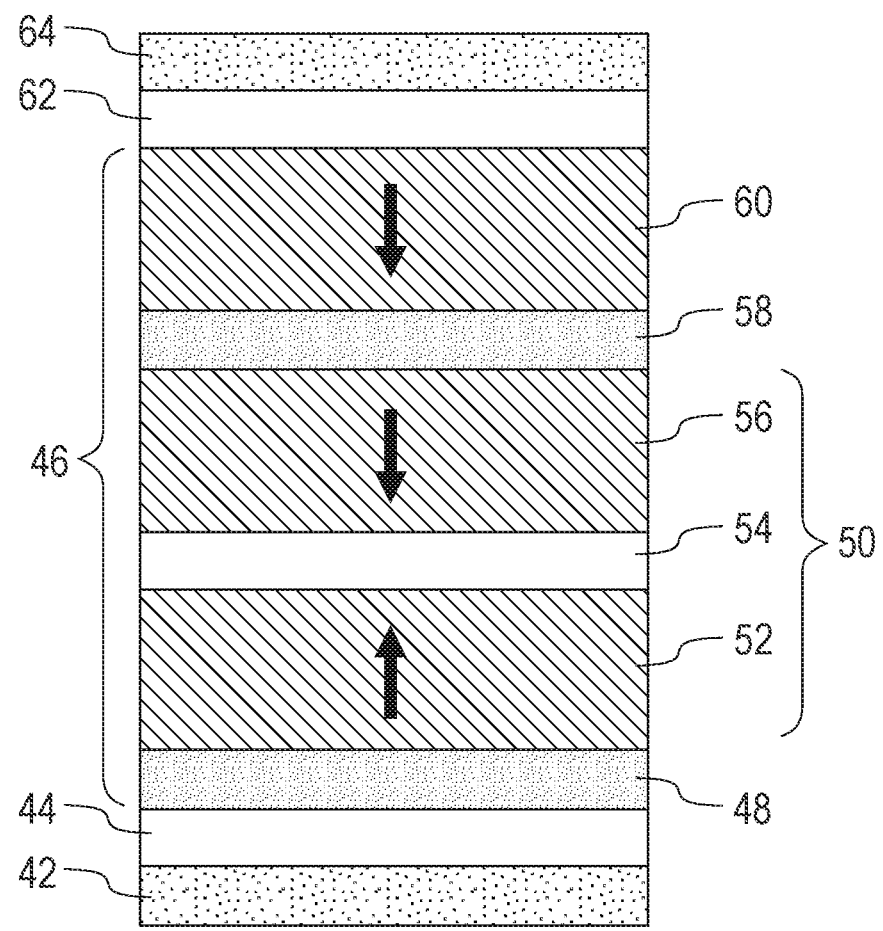
FIG. 3 is a cross sectional view of an exemplary top pinned MTJ stack in accordance with one embodiment of the present application that is positioned between a bottom electrode and a top electrode.

Referring to FIG. 3, there is illustrated an exemplary top pinned MTJ stack 46 in accordance with one embodiment of the present application that is positioned between a bottom electrode 42 and a top electrode 64. In some embodiments, a metallic seed layer 44, and/or a MTJ cap layer 62 can be formed as shown in FIG. 3. The top pinned MTJ stack 46 can be used to provide performance enhancement such as faster switching times and lower write errors to a STT MRAM.

The top pinned MTJ stack 46 of the present application includes a magnetic free layer stack 50 located on an insulating AlN seed layer 48 having hexagonal symmetry (i.e., a hexagonal crystal structure). The magnetic free layer stack 50 includes a first magnetic layer 52, a synthetic anti-ferromagnetic coupling layer 54, and a second magnetic layer 56. A tunnel barrier layer 58 having cubic symmetry (i.e., a cubic crystal structure) is located on the second magnetic layer 56 of the magnetic free layer stack 50, and a magnetic pinned layer 60 is located on the tunnel barrier layer 58. The various elements shown in FIG. 4 will now be described in greater detail.

The bottom electrode 42 is located on a surface of an electrically conductive structure (not shown). The electrically conductive structure is embedded in an interconnect dielectric material layer (also not shown). Another interconnect dielectric material layer (not shown) may embed the metallic seed layer 44, the top pinned MTJ stack 46, the MTJ cap 62 and at least a portion of the top electrode 64. Another electrically conductive structure contacts a surface of the top electrode 64. The bottom electrode 42 may be composed of an electrically conductive material such as, for example, copper, and can be formed utilizing techniques well known to those skilled in the art. The bottom electrode 42 may be formed on a recessed surface or a non-recessed surface of the electrically conductive structure.

When employed, the metallic seed layer 44 is formed on a physically exposed surface of the bottom electrode 42. The metallic seed layer 44 that is employed in the present application includes any conductive metal that has hexagonal symmetry (i.e., a hexagonal crystal structure) and has a strong crystalline texture. By "strong crystalline texture" it is meant that for the majority of the crystalline grains at least one of the crystalline axis is parallel among these grains, e.g., [111] direction of a FCC is parallel to the film growth direction. In one embodiment, the metallic seed layer 44 may include a bilayer of tantalum (Ta) and ruthenium (Ru). In another embodiment, the metallic seed layer 44 may include a bilayer of Ta and platinum (Pt). The metallic seed layer 44 may have a total thickness from 1 nm to 50 nm. The metallic seed layer 44 can be formed utilizing a conventional deposition process including, for example, chemical vapor deposition (CVD), plasma enhanced chemical vapor deposition (PECVD), physical vapor deposition (PVD), atomic layer deposition (ALD) or sputtering.

As mentioned above, the insulating AlN seed layer 48, which is formed on the metallic seed layer 44, has hexagonal symmetry (i.e., a hexagonal crystal structure). The insulating AlN seed layer 48 can be formed by sputtering from a stoichiometric AlN target, by reactive sputtering with nitrogen using a metallic Al target, or by utilizing a combination of both sputtering methods. The insulating AlN seed layer 48 has a thickness as to provide an appropriate tunneling resistance. In one example, the insulating AlN seed layer 48 has a thickness from 0.5 nm to 2.0 nm. The insulating AlN seed layer 48 has a resistance from 1 Ohm·$\mu m^2$ to 20 Ohm·$\mu m^2$.

The first magnetic layer 52 of the magnetic free layer stack 50 is then formed on the insulating AlN seed layer 48. The first magnetic layer 52 is composed of a magnetic material (i.e., a first magnetic material) with a magnetization that can be changed in orientation relative to the magnetization orientation of the magnetic pinned layer 60. The first magnetic layer 52 has hexagonal symmetry. Exemplary materials for the first magnetic layer 52 include alloys and/or multilayers of cobalt (Co), iron (Fe), alloys of cobalt-iron, nickel (Ni), alloys of nickel-iron, and alloys of cobalt-iron-boron (B). Typically, the first magnetic layer 52 is composed of multilayers of Co or multilayers of a Co alloy containing at least 50 atomic percent Co. The first magnetic layer 52 may have a thickness from 0.3 nm to 3 nm. The first magnetic layer 52 of the magnetic free layer stack 50 can be formed by utilizing a deposition process such as, for example, CVD, PECVD, PVD, ALD or sputtering.

The synthetic anti-ferromagnetic coupling layer 54 is then formed on the first magnetic layer 52. The synthetic anti-ferromagnetic coupling layer 54 is composed of a non-magnetic material that can couple the first and second magnetic layers (52, 56) of the magnetic free layer stack 50 anti-ferromagnetically. Exemplary materials that can be used as the synthetic anti-ferromagnetic coupling layer 54 include, but are not limited to, ruthenium (Ru), iridium (Ir) or rhodium (Rh). The synthetic anti-ferromagnetic coupling layer 54 has hexagonal symmetry. The synthetic anti-ferromagnetic coupling layer 54 can have a thickness from 0.2 nm to 1.2 nm. The synthetic anti-ferromagnetic coupling layer 54 may be formed by utilizing a deposition process such as, for example, CVD, PECVD, PVD, ALD or sputtering.

The second magnetic layer 56 is then formed on the synthetic anti-ferromagnetic coupling layer 54. The second magnetic layer 56 of the magnetic free layer stack 50 includes a lower region (composed of one or more sub-layers) having hexagonal symmetry and an upper region (composed of one or more sub-layers) that has cubic symmetry or is amorphous (i.e., a material that lacks any long range crystal structure). The transition from hexagonal symmetry to cubic symmetry or amorphous may be obtained by inserting a symmetry transition region (alternatively referred to as symmetry breaking region) between the upper and lower regions of the second magnetic layer 56. The various regions of the second magnetic layer 56 are not shown in the drawings.

The upper and lower regions of the second magnetic layer 56 may be composed of a second magnetic material with a magnetization that can be changed in orientation relative to the magnetization orientation of the magnetic pinned layer 60. The upper and lower regions of the second magnetic layer 56 are typically composed of a compositionally different magnetic material. In one example, the lower region of the second magnetic layer 56 is composed of Co or a Co alloy containing at least 50 atomic percent Co, and the upper region of the second magnetic layer 56 is composed of a CoFeB alloy or a CoFeB/Fe bilayer. The lower region of the second magnetic layer 56 may have a thickness from 0.3 nm to 1.2 nm, and the upper region of the second magnetic layer 56 may have a thickness from 0.5 nm to 1.5 nm.

In one embodiment, the symmetry transition region that is located between the upper and lower regions of the second magnetic layer 56 may include Ta, W, Zr, Nb or Mo. In another embodiment, the symmetry transition region that is located between the upper and lower regions of the second magnetic layer 56 may include an alloy of Ta, W, Zr, Nb or Mo. In yet a further embodiment, the symmetry transition region that is located between the upper and lower regions of the second magnetic layer 56 may include an alloy of Ta, W, Zr, Nb or Mo with Co or Fe. In yet an even further embodiment, the symmetry transition region that is located between the upper and lower regions of the second magnetic layer 56 may include an alloy of three or more of Ta, W, Zr, Nb or Mo. The symmetry transition region that is located between the upper and lower regions of the second magnetic layer 56 may have a thickness from 0.1 nm to 1 nm.

The second magnetic layer 56 including the various regions may be formed utilizing one or more deposition processes such as, for example, CVD, PECVD, PVD, ALD or sputtering. Typically, each region is deposited using a same deposition techniques without breaking vacuum between each deposition. The second magnetic layer 56 of the magnetic free layer stack 54 may have a total thickness from 0.3 nm to 3 nm.

The tunnel barrier layer 58 having cubic symmetry is then formed on the second magnetic layer 56 of the magnetic free layer stack 50. The tunnel barrier layer 58 is formed at such a thickness as to provide an appropriate tunneling resistance. An exemplary material for the tunnel barrier layer 58 is magnesium oxide. The thickness of the tunnel barrier layer 58 is typically from 0.5 nm to 1.5 nm. The tunnel barrier layer 58 can be formed by utilizing a deposition process such as, for example, CVD, PECVD, PVD, or sputtering. In one example, and for a magnesium oxide tunnel barrier material, the magnesium oxide tunnel barrier material may be formed by sputtering from a stoichiometric magnesium oxide target. In another example, and for a magnesium oxide tunnel barrier material, the magnesium oxide tunnel barrier material may be formed by deposition of a layer of magnesium and thereafter subjecting the magnesium layer to an oxidation process. In yet another example, and for a magnesium oxide tunnel barrier material, the magnesium oxide tunnel barrier material may be formed by utilizing a combination of the above processes.

The magnetic pinned layer 60 (i.e., a magnetic reference layer having a fix magnetization) is then formed on the tunnel barrier layer 58. The magnetic pinned layer 60 has at least a lower region that has cubic symmetry. In some embodiments, the upper region of the magnetic pinned layer 60 may also have cubic symmetric or it may contain a symmetry transition region followed by a hexagonal region.

In one embodiment, the magnetic pinned layer 60 includes a lower region that is composed of a Fe rich (i.e., 50 atomic percent of greater Fe) CoFeB alloy that has a thickness from 0.5 nm to 1.5 nm, and an upper region that is composed of either (i) an oxide such as, for example, MgO, Mg—Al oxide, or a Mg—Ir oxide, that provides high anisotropy and thus makes the magnetic pinned layer 60 insensitive to write currents that can pass through the top pinned MTJ stack 46, or (ii) a layer of a symmetry breaking material as defined above, followed by a high anisotropy multilayer of Co/Pt or Co/Pt combined with one of Ru, Ir or Rh. The magnetic pinned layer 60 can be formed utilizing deposition process such as, for example, CVD, PECVD, PVD, or sputtering. The magnetic pinned layer 60 may have a thickness from 0.2 nm to 1.8 nm.

In some embodiments, a MTJ cap layer 62 can be formed on a physically exposed surface of the magnetic pinned layer 60. When present, the MTJ cap layer 62 may be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer 62 may be formed utilizing a deposition process including, for example, CVD, PECVD, ALD, PVD, or sputtering. The MTJ cap layer 62 may have a thickness from 2 nm to 25 nm; other thicknesses are possible and can be used in the present application as the thickness of the MTJ cap layer 62.

The top electrode 64 includes an electrically conductive material such as, for example copper (Cu). In one embodiment, the top electrode 64 is composed of a same electrically conductive material as the bottom electrode 42. In another embodiment, the top electrode 64 is composed of a compositionally different electrically conductive material than the bottom electrode 42. The top electrode 64 may be formed utilizing a deposition process.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A top pinned magnetic tunnel junction (MTJ) stack comprising:
  a magnetic free layer stack located on an insulating aluminum nitride seed layer having hexagonal symmetry, wherein the magnetic free layer stack includes a first magnetic layer, a synthetic anti-ferromagnetic coupling layer, and a second magnetic layer, wherein the first magnetic layer of the magnetic free layer stack has hexagonal symmetry, and the second magnetic layer of the magnetic free layer stack comprises a lower region having hexagonal symmetry and an upper region that has cubic symmetry or is amorphous;
  a tunnel barrier layer having cubic symmetry located on the second magnetic layer of the magnetic free layer stack; and
  a magnetic pinned layer located on the tunnel barrier layer.

2. The top pinned MTJ stack of claim 1, further comprising a symmetry transition region located between the lower region and the upper region of the second magnetic layer.

3. The top pinned MTJ stack of claim 1, wherein the magnetic pinned layer has at least a lower region of cubic symmetry.

4. The top pinned MTJ stack of claim 3, wherein the magnetic pinned layer has an upper region that has hexagonal symmetry and wherein a symmetry transition region is present between the lower region and the upper region of the magnetic pinned layer.

5. The top pinned MTJ stack of claim 1, wherein the synthetic anti-ferromagnetic coupling layer is composed of Ru, Ir or Rh.

6. The top pinned MTJ stack of claim 1, wherein the tunnel barrier layer is composed of magnesium oxide.

7. The top pinned MTJ stack of claim 1, wherein the magnetic pinned layer has a lower region composed of a Fe-rich CoFeB alloy, and an upper region composed of one of MgO, Mg—Al oxide or Mg—Ir oxide.

8. The top pinned MTJ stack of claim 1, wherein the magnetic pinned layer has a lower region composed of a Fe-rich CoFeB alloy, a middle symmetry transition region, and an upper region composed of a multilayer of Co/Pt or a multilayer of Co/Pt with one of Ru, Ir or Rh.

9. The top pinned MTJ stack of claim 1, wherein the lower region of the second magnetic layer is composed of Co or a Co alloy containing at least 50 atomic percent Co, and the upper region of the second magnetic layer is composed of CoFeB or a CoFeB/Fe bilayer, and wherein a middle symmetry transition region is positioned between the lower region of the second magnetic layer and the upper region of the second magnetic layer.

10. A spin-transfer torque magnetoresistive random access memory (STT MRAM) comprising:
a top pinned magnetic tunnel junction (MTJ) stack located between a bottom electrode and a top electrode, wherein the top pinned MTJ stack comprises:
a magnetic free layer stack located on an insulating aluminum nitride seed layer having hexagonal symmetry, wherein the magnetic free layer stack includes a first magnetic layer, a synthetic anti-ferromagnetic coupling layer, and a second magnetic layer, wherein the first magnetic layer of the magnetic free layer stack has hexagonal symmetry, and the second magnetic layer of the magnetic free layer stack comprises a lower region having hexagonal symmetry and an upper region that has cubic symmetry or is amorphous;
a tunnel barrier layer having cubic symmetry located on the second magnetic layer of the magnetic free layer stack; and
a magnetic pinned layer located on the tunnel barrier layer.

11. The STT MRAM of claim 10, further comprising a metallic seed layer having hexagonal symmetry located between the insulating AlN seed layer and the bottom electrode.

12. The STT MRAM of claim 11, wherein the metallic seed layer has a crystalline texture.

13. The STT MRAM of claim 10, further comprising a MTJ cap layer located between the magnetic pinned layer and the top electrode.

14. The STT MRAM of claim 10, further comprising a symmetry transition region located between the lower region and the upper region of the second magnetic layer.

15. The STT MRAM of claim 10, wherein the magnetic pinned layer has at least a lower region of cubic symmetry.

16. The STT MRAM of claim 15, wherein the magnetic pinned layer has an upper region that has hexagonal symmetry and wherein a symmetry transition region is present between the lower region and the upper region of the magnetic pinned layer.

17. The STT MRAM of claim 10, wherein the synthetic anti-ferromagnetic coupling layer is composed of Ru, Ir or Rh.

18. The STT MRAM of claim 10, wherein the magnetic pinned layer has a lower region composed of a Fe-rich CoFeB alloy, and an upper region composed of one of MgO, Mg—Al oxide or Mg—Ir oxide.

19. The STT MRAM of claim 10, wherein the magnetic pinned layer has a lower region composed of a Fe-rich CoFeB alloy, a middle symmetry transition region, and an upper region composed of a multilayer of Co/Pt or a multilayer of Co/Pt with one of Ru, Ir or Rh.

20. The STT MRAM of claim 10, wherein the lower region of the second magnetic layer is composed of Co or a Co alloy containing at least 50 atomic percent Co, and the upper region of the second magnetic layer is composed of CoFeB or a CoFeB/Fe bilayer, and wherein a middle symmetry transition region is positioned between the lower region of the second magnetic layer and the upper region of the second magnetic layer.

* * * * *